US006831516B2

(12) United States Patent
Hughes

(10) Patent No.: US 6,831,516 B2
(45) Date of Patent: Dec. 14, 2004

(54) METHOD OF FORMING A VARIABLE PROPAGATION DELAY SEMICONDUCTOR DEVICE AND STRUCTURE THEREFOR

(75) Inventor: Joseph Hughes, Gilbert, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 35 days.

(21) Appl. No.: 10/369,230

(22) Filed: Feb. 20, 2003

(65) Prior Publication Data

US 2004/0164802 A1 Aug. 26, 2004

(51) Int. Cl.[7] ................................................ H03F 3/45
(52) U.S. Cl. ..................................... 330/261; 330/280
(58) Field of Search ............................... 330/252, 261, 330/280, 310; 327/284

(56) References Cited

U.S. PATENT DOCUMENTS

| 5,063,311 A | | 11/1991 | Swapp | |
|---|---|---|---|---|
| 5,306,971 A | * | 4/1994 | McCune | ..................... 327/270 |
| 5,606,272 A | * | 2/1997 | Behbahani et al. | ........... 327/65 |

OTHER PUBLICATIONS

John Arthur McNeill, Boston University College of Engineering Dissertation, "Jitter in Ring Oscillators", 1994.

* cited by examiner

*Primary Examiner*—Steven J. Mottola
(74) *Attorney, Agent, or Firm*—Robert F. Hightower

(57) ABSTRACT

A differential amplifier (10, 60) is formed to have a propagation delay that varied responsively to a control signal received on a differential control signal input. The propagation delay is varied by changing the bias current of a pair of differential input transistor (11, 13).

20 Claims, 6 Drawing Sheets

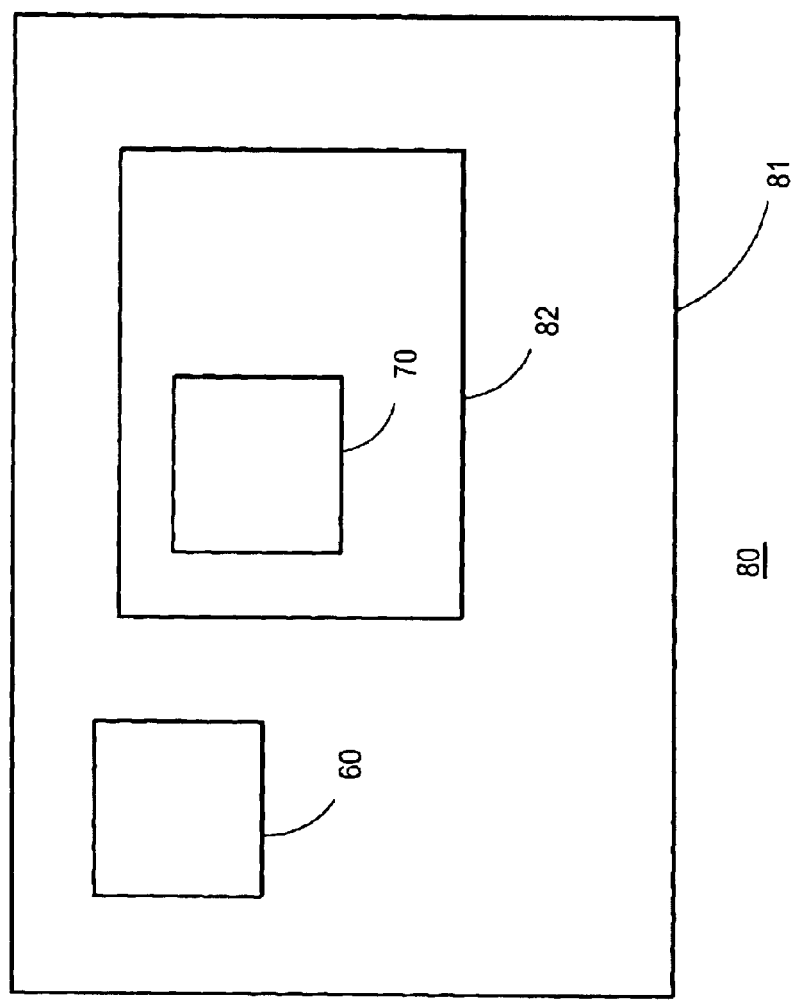

METHOD OF FORMING A VARIABLE PROPAGATION DELAY SEMICONDUCTOR DEVICE AND STRUCTURE THEREFOR

BACKGROUND OF THE INVENTION

The present invention relates, in general, to electronics, and more particularly, to methods of forming semiconductor amplifiers having a variable propagation delay.

In the past, the semiconductor industry utilized various methods and circuits to implement differential amplifiers including differential amplifiers that had a variable propagation delay. Such variable propagation delay differential amplifiers had various applications including use as a ring oscillator. One example of such a variable propagation delay differential amplifier is disclosed in U.S. Pat. No. 5,063,311 issued to Mavin Swapp on Nov. 5, 1991. Typically, such differential amplifiers varied the voltage swing of the output signal in order to vary the propagation delay through the differential amplifier. Varying the voltage swing resulted in a non-linear propagation delay variation. Typically the propagation delay variation had a non-linearity of greater than about ten per cent (10%), that is, the propagation delay variation deviated from an ideal straight line variation. Also, varying the output voltage swing often produced a large voltage swing that caused deep saturation of the input of subsequent circuit elements that received the output voltage. The saturation resulted in detrimental operation of circuits that utilized the differential amplifier. Another problem with prior variable propagation delay differential amplifiers was RMS cycle-to-cycle jitter or jitter. The non-linearity also increased the jitter of the output signal of the amplifier. Typically, varying the voltage swing produce jitter that was greater than about ten pico-seconds (10 psec.).

Some prior differential amplifiers switched the differential amplifier inputs between one or more data signals having different signal paths. Switching the different signal paths in or out also switched the input signals between input signals having various phase relationships and caused additional jitter in the output signal.

Accordingly, it is desirable to have a differential amplifier that has a variable propagation delay, that does not change the voltage swing of the output signal, that has a more linear output signal, and that has reduced jitter in the output signal.

BRIEF DESCRIPTION OF THE DRAWINGS

FIG. 6 schematically illustrates a plan view of a semiconductor device incorporating the differential amplifier of FIG. 4 in accordance with the present invention.

For simplicity and clarity of illustration, elements in the figures are not necessarily to scale, and the same reference numbers in different figures denote the same elements. Additionally, descriptions and details of well known steps and elements are omitted for simplicity of the description. As used herein current carrying electrode means an element of a device that carries current through the device such as a source or a drain of an MOS transistor or an emitter or a collector of a bipolar transistor, and a control electrode means an element of the device that controls current through the device such as a gate of an MOS transistor or a base of a bipolar transistor.

DETAILED DESCRIPTION OF THE DRAWINGS

Figure 1:
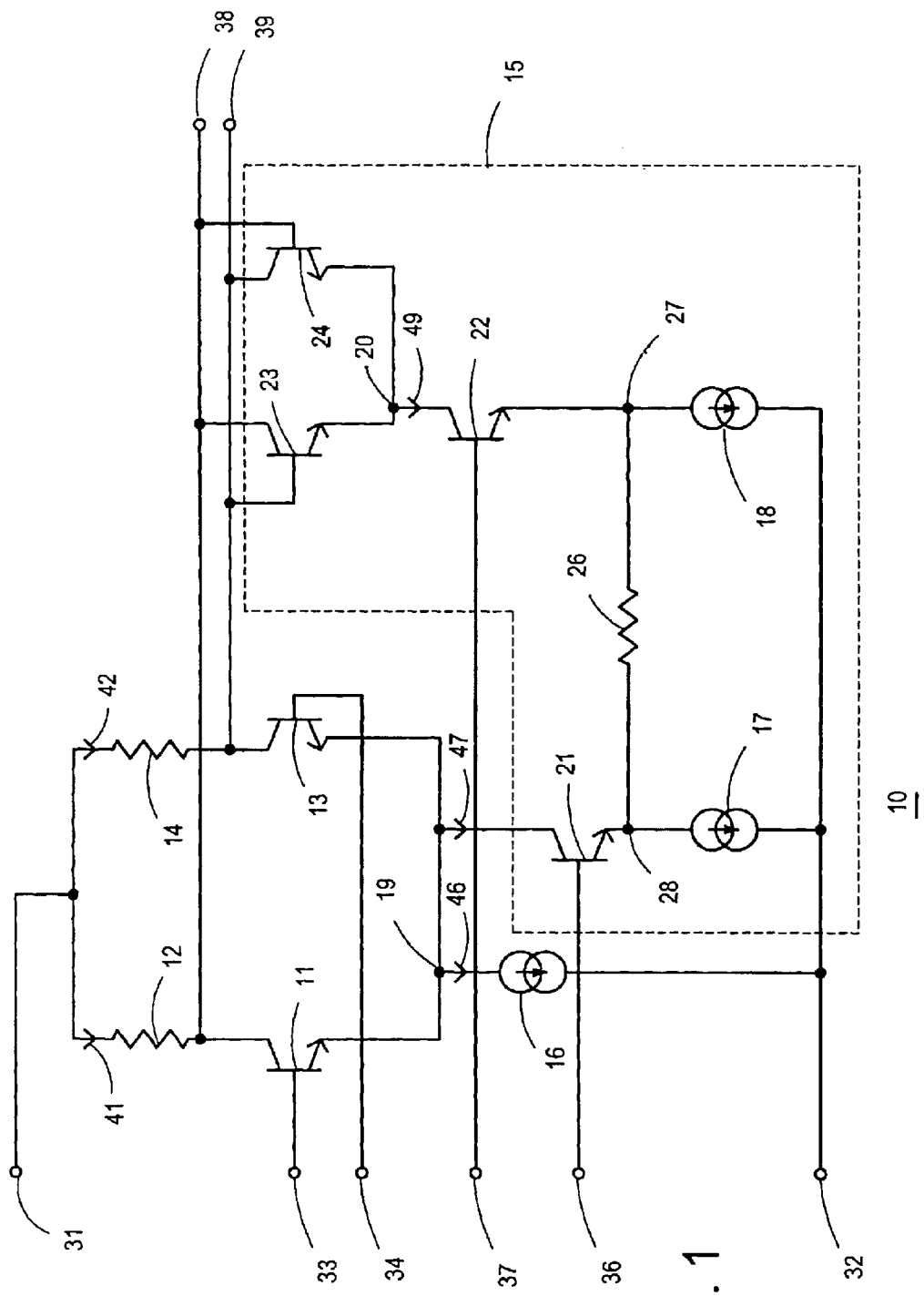
FIG. 1 schematically illustrates a portion of an embodiment of a differential amplifier having a variable propagation delay in accordance with the present invention.

FIG. 1 schematically illustrates a portion of an embodiment of a differential amplifier 10 that has a variable propagation delay, high linearity, low jitter, and an output voltage swing that has a constant value. Differential amplifier 10 is coupled to receive power from a power input 31 and a power return 32. Amplifier 10 is also formed to receive digital data as differential data input signals on a pair of differential data inputs comprising a data input 33 and a data bar input 34. A differential input transistor pair is formed to receive the differential data input signals and generate a differential output voltage or output voltage on a data output 39 and a data bar output 38. The differential input transistor pair is formed to include a first differential input transistor 11 and a second differential input transistor 13. Transistors 11 and 13 are connected through load resistors 12 and 14, respectively, to power input 31. A first current source or fixed current source 16 is formed to generate a constant or fixed bias current 46, illustrated by an arrow, that flows through each of transistors 11 and 13. Typically, fixed bias current 46 flows through one of transistors 11 or 13 depending on the state of the data input signal applied to inputs 33 and 34 although some of current 46 may flow through both of transistors 11 and 13 during transitions of the data input signal. A variable current source 15 is formed to generate a variable bias current 47, illustrated by an arrow, responsively to a differential delay control signal that is received on a first delay control input 36 and a second delay control input 37. In the preferred embodiment, amplifier 10 is formed to receive analog delay control signals on inputs 36 and 37 and responsively generate variable bias current 47. Typically, variable bias current 47 flows through one of transistors 11 or 13 depending on the state of the data input signal applied to inputs 33 and 34 although some of current 47 may flow through both of transistors 11 and 13 during transitions. In the preferred embodiment, variable current source 15 includes a first delay control current source 17, a second delay control current source 18, a first delay control transistor 21, a second delay control transistor 22, a gain resistor 26, a first steering transistor 23, and a second steering transistor 24. In this preferred embodiment, sources 16, 17, and 18 are formed as constant current sources that include temperature and voltage compensations. Such compensated current sources are well known to those skilled in the art.

Amplifier 10 is formed to have a load current 41 or 42 flowing through one of load resistors 12 or 14, respectively, responsively to the value of the data input signal. The value of load current 41 or 42 that is flowing remains constant regardless of the value of variable bias current 47, thus, the value of the voltage swing of the output voltage remains constant. Those skilled in the art understand that the value of a voltage swing means the difference between the maximum and minimum values of the voltage swing.

Figure 2:
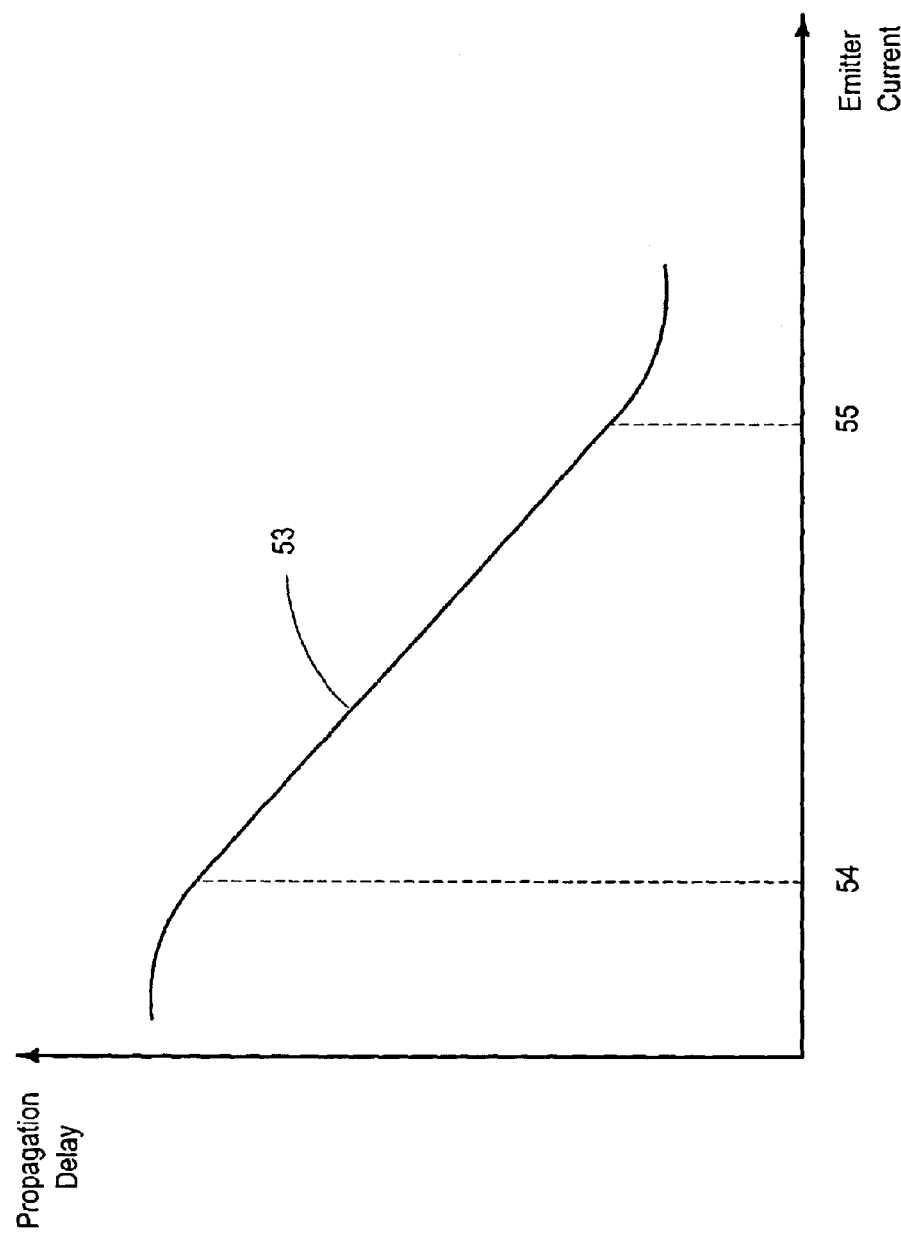
FIG. 2 is a graph illustrating some characteristics of the differential amplifier of FIG. 1 in accordance with the present invention.

Fixed bias current 46 flows through either the path of resistor 12 and transistor 11 or the path of resistor 14 and transistor 13 depending on the state of inputs 33 and 34. Current 46 then flows to a current node 19 and to source 16. The value of current 46 remains fixed or constant and biases transistors 11 and 13 to operate on a first portion of the propagation delay verses emitter current curve for transistors 11 and 13. An example of a propagation delay curve and such an operation point are illustrated in FIG. 2 and will be explained further hereinafter. Thus, the value of current 46 establishes a first operating point or first propagation delay for amplifier 10.

The amount or value of variable bias current 47 that flows through transistors 11 and 13 is controlled by transistor 21 and 22 responsively to the value of the delay control signal applied to inputs 36 and 37. When transistor 21 is not conducting, transistor 22 is fully conducting and all of the current generated by sources 17 and 18 flows through one of resistors 12 or 14 responsively to the data input signal, then through one of transistors 23 or 24 as an excess current 49 and through transistor 22 to node 27 where it divides and a portion flows to source 18 and another portion flows through resistor 26 to source 17. Excess current 49 is the amount of load current 41 or 42 that does not flow through transistor 11 or 13 as a bias current. Those skilled in the art will understand that the amount of current flowing through each of transistors 23 and 24 depends on the value of the output voltage, thus, it depends on the value of the data input signals applied to inputs 33 and 34. As transistor 21 becomes enabled by the delay control signal and transistor 22 correspondingly becomes less enabled, some of the current generated by sources 17 and 18 begins to flow as variable bias current 47 through one of transistors 11 or 13 to node 19 and through transistor 21 to node 28 where a portion flows to source 17 and another portion flows through resistor 26 to source 18. The remainder of the current generated by sources 17 and 18 flows through the corresponding one of resistors 12 or 14, then through one of transistors 23 or 24 to node 20 as excess current 49 that flows through transistor 22 to node 27 and then divides at node 27 where a portion flows to source 18 and another portion flows through resistor 26 to source 17. Note that the value of load current flowing through resistors 12 and 14 does not change. Regardless of the state of transistors 21 and 22, all the current from sources 16, 17, and 18 always flows through resistors 12 and 14. Thus, the value of the load current that flows though resistors 12 and 14 is the sum of the fixed bias current and the current from sources 17 and 18, and this value of load current remains constant regardless of the amount of bias current that flows through transistors 11 and 13. As a result, the output voltage swing remains constant regardless of the value of the data input signal, thus, the output voltage can not cause deep saturation of the device that receives the output voltage.

The value of excess current 49 is established to ensure that transistors 23 and 24 do not latch the output data on outputs 38 and 39. Typically, the maximum value of current 49 is less than ten times, and preferably less than seven to eight times, the value of current 46 to ensure such operation. The value of resistor 26 is selected to provide a desired range of operating values for the delay control signal. The voltage dropped across resistor 26 sets the gain of the differential pair formed by transistors 21 and 22 which correspondingly sets the amount of the voltage swing between inputs 36 and 37 that results in changes in transistors 21 and 22. Input voltage values beyond this active voltage swing value do not result in changes to transistors 21 and 22. The lower the value of resistor 26 the higher the gain provided by transistors 21 and 22, and correspondingly, the more variable bias current 47 changes for a given change in the delay control signal. The current generated by sources 17 and 18 typically are formed to be equal in order to achieve a balanced response from transistors 21 and 22.

FIG. 2 is a graph having a plot 53 illustrating a typical propagation delay verses emitter current characteristic of a transistor such as transistors 11 and 13. As illustrated, as the emitter current of the transistor increases, the propagation delay typically decreases. Referring to both FIG. 1 and FIG. 2, sources 15 and 16 typically are formed so that the values of currents 46 and 47 operate transistors 11 and 13 in the linear region of the propagation delay characteristics. For the characteristics illustrated in plot 53, currents 46 and 47 are selected to operate transistors 11 and 13 between a first operating point 54 and a second operating point 55. The value of current 46 typically is selected to provide a current value that forms a maximum propagation delay, thus, is selected to operate transistors 11 and 13 at point 54. The maximum value of variable bias current 47 is selected so that the sum of currents 46 and 47 generate a second bias current that provides a minimum propagation delay and operates transistors 11 and 13 at point 55. As the value of the delay control signal is changed, the value of variable bias current 47 changes thereby changing the value of the second bias current so that the propagation delay of transistors 11 and 13 moves between points 54 and 55 thereby providing a variable propagation delay responsively to the value of the delay control input signal. Thus, amplifier 10 is formed to change the bias current responsively to the value of the delay control signals thereby changing the propagation delay of amplifier 10. Consequently, amplifier 10 is formed so that a data signal applied to inputs 33 and 34 will experience a propagation delay to outputs 38 and 39 based on the value of the delay control signal applied to inputs 36 and 37. Typically, transistors 11 and 13 have a very large linear operating range, and points 54 and 55 are selected along that linear range based on a desired amount of propagation delay. Points 54 and 55 are shown as spaced far apart on plot 53 for simplicity of the illustration; however, currents 46 and 47 may be selected to provide operation over a smaller operating range.

Those skilled in the art will note that source 15 could have other circuit configurations as long as variable bias current 47 is formed responsively to the delay control signal and as long as the load current remains fixed. For example, source 15 may have only one current source, such as source 17, that is connected to the emitters of transistors 21 and 22 via emitter resistors. Additionally, input 36 can be a single ended input with input 37 connected to a fixed reference voltage. Additionally, amplifier 10 is described using a digital data input signal, however, those skilled in the art will understand that an analog data input signal could be used to provide a similar delay characteristic that in the frequency domain forms a variable frequency response. Such a variable characteristic could be used to form filters having variable frequency responses including variable loop filters.

In order to facilitate this operation, transistor 11 of amplifier 10 has a base connected to input 33, an emitter connected to node 19, and a collector connected to both output 38 and a first terminal of resistor 12 which has a second terminal connected to input 31. Transistor 13 has a base connected to input 34, an emitter connected to node 19, and a collector connected to output 39 and to a first terminal of resistor 14 which is a second terminal connected to input 31. Source 16 is connected between node 19 and return 32 and has a first terminal connected to node 19 and a second terminal connected to return 32. Transistor 21 has a base connected to input 36, a collector connected to node 19, and an emitter connected to a first terminal of resistor 26 and to a first terminal of source 17 which has a second terminal connected to return 32. Transistor 22 has a base connected to input 37, a collector connected to node 20, and an emitter connected to the second terminal of resistor 26 and to a first terminal of source 18 which has a second terminal connected to return 32. Transistor 23 has a base connected to output 39, a collector connected to output 38, and an emitter connected to node 20. Transistor 24 has a base connected to output 38, a collector connected to output 39, and an emitter connected to node 20.

In one example of amplifier 10, current source 16 generated a current of one hundred (100) micro-amps., current sources 17 and 18 each generated a current of two (200) hundred micro-amps., resistor 26 was eight thousand (8000) ohms, and load resistors 12 and 14 each were eight hundred thirty three (833) ohms. The output voltage had a voltage swing of two hundred (200) milli-volts, and the voltage applied between input 31 and return 32 ranged from two and one-half volts (2.5 V) to five volts (5.0 V). As the differential value of the delay control signal applied to input 36 relative to input 37 varied from minus five hundred milli-volts to plus five hundred milli-volts, the propagation delay varied from one and two thirds nano-seconds (1.67 nsec.) to four hundred fifty-five pico-seconds (455 psec.) During this delay variation, the output voltage swing remained constant, had a non-linearity of less than one per cent (1%), and a cycle-to-cycle jitter of less than four pico-seconds (4.0 psec.) and typically less than 3.8 psec.

Figure 3:
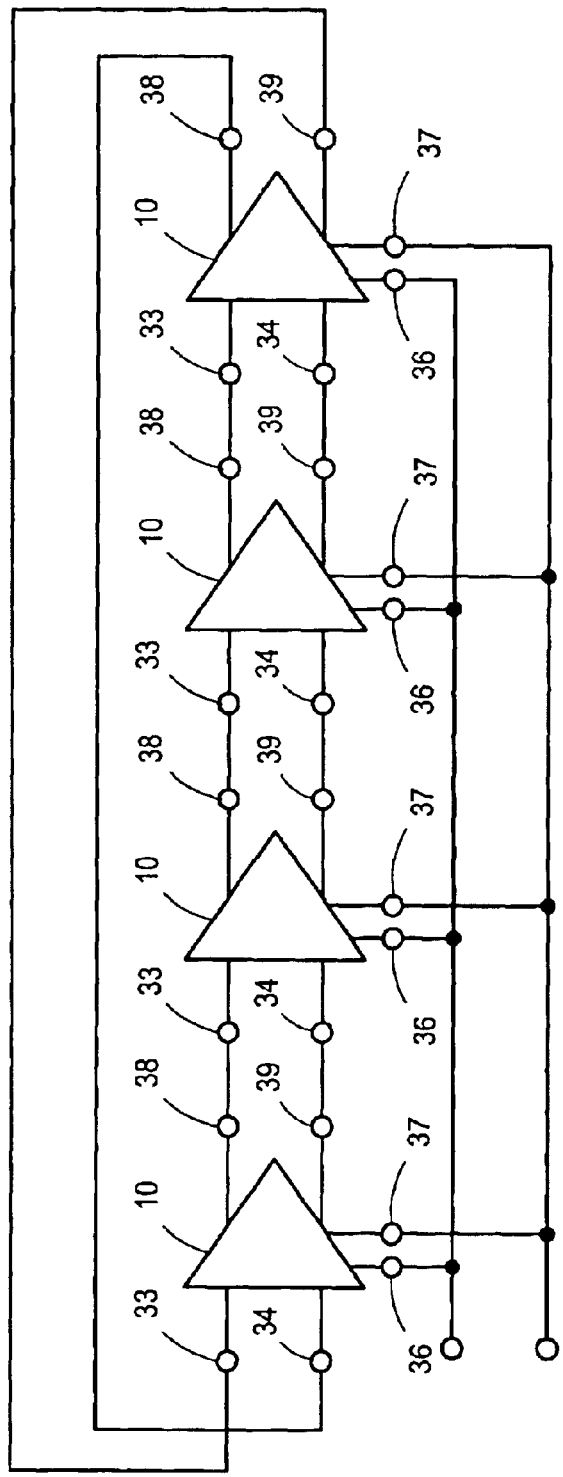
FIG. 3 schematically illustrates a portion of an embodiment of an oscillator that utilizes the differential amplifier of FIG. 1 in accordance with the present invention.

FIG. 3 schematically illustrates a portion of an embodiment of a variable frequency oscillator 70 that utilizes a plurality amplifiers 10 explained in the description of FIG. 1 and FIG. 2. Oscillator 70 may be used in various applications. For example oscillator 70 may be the variable frequency oscillator of a phase locked loop system where outputs of a phase detector are connect to inputs 36 and 37 to control the frequency of the oscillator. Although oscillator 70 is illustrated to have four amplifier 10 stages, any number of stages may be used to form the plurality of stages of oscillator 70.

Figure 4:
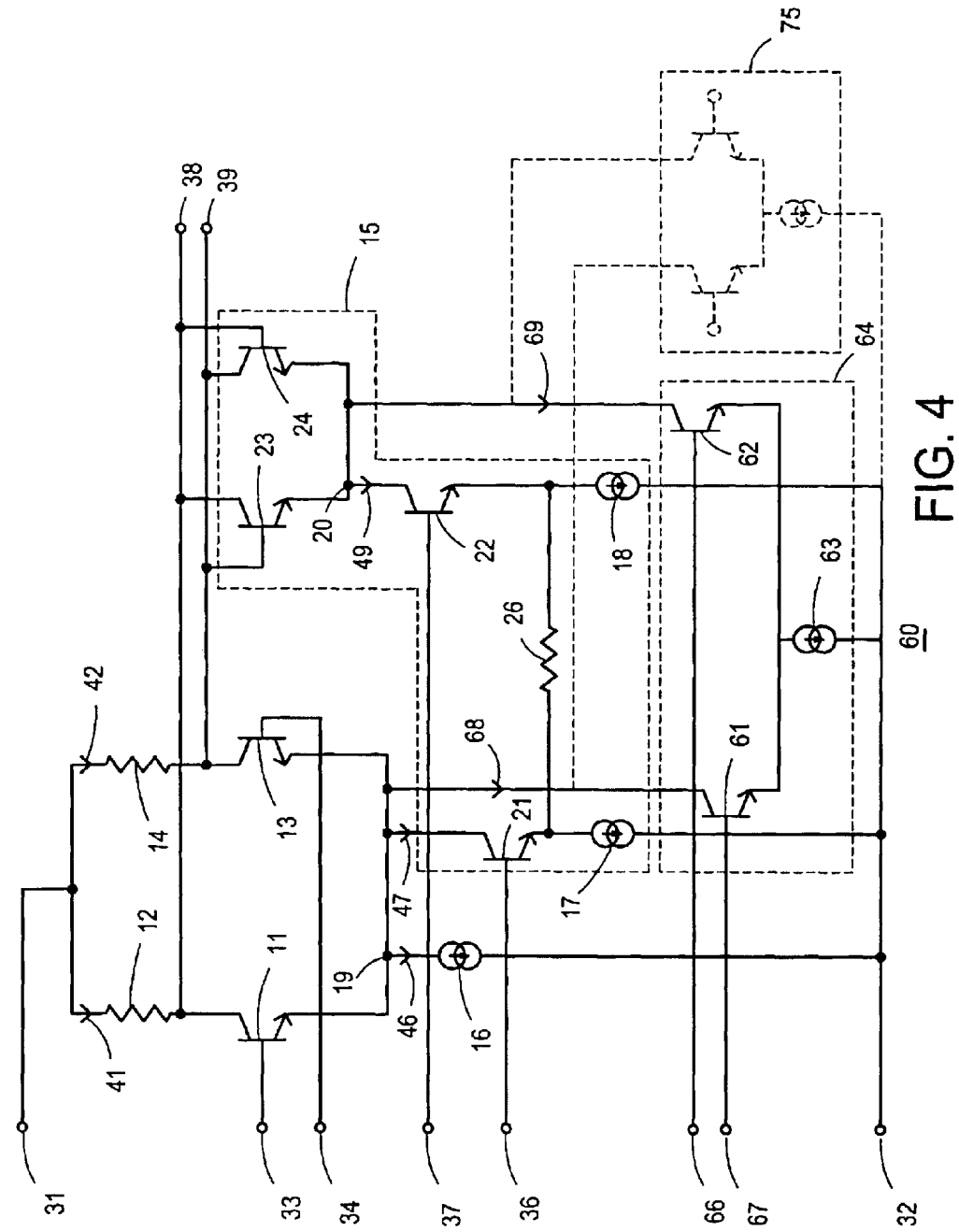
FIG. 4 schematically illustrates an embodiment of a portion of a differential amplifier that is an alternate embodiment to the differential amplifier of FIG. 1 in accordance with the present invention.

FIG. 4 schematically illustrates a portion of an embodiment of a differential amplifier 60 that is an alternate embodiment of amplifier 10 explained in the description of FIG. 1, FIG. 2, and FIG. 3. Amplifier 60 includes a range select current source 64 that forms a range select bias current 68 that flows through transistors 11 and 13 responsively to a range select control signal. The range select control signal is applied to a pair of range select control inputs 66 and 67. Range select current source 64 includes a first select transistor 61, a second select transistor 62, and a select current source 63. In the preferred embodiment, inputs 66 and 67 are digital inputs that alternately enable one of transistors 61 or 62. When transistor 62 is enabled, transistor 61 is not conducting and all of the current from source 63 flows through one of resistors 12 or 14 responsively to inputs 33 and 34, and flows as current 69 through transistors 23 and 24 to node 20, then through transistor 62 to source 63. When the range select control signal enables transistor 61, transistor 62 is disabled and the current from source 63 flows through either the path of resistor 12 and transistor 11 or the path of resistor 14 and transistor 13 as range select bias current 68 and then flows to node 19 and through transistor 61 to source 63.

Figure 5:
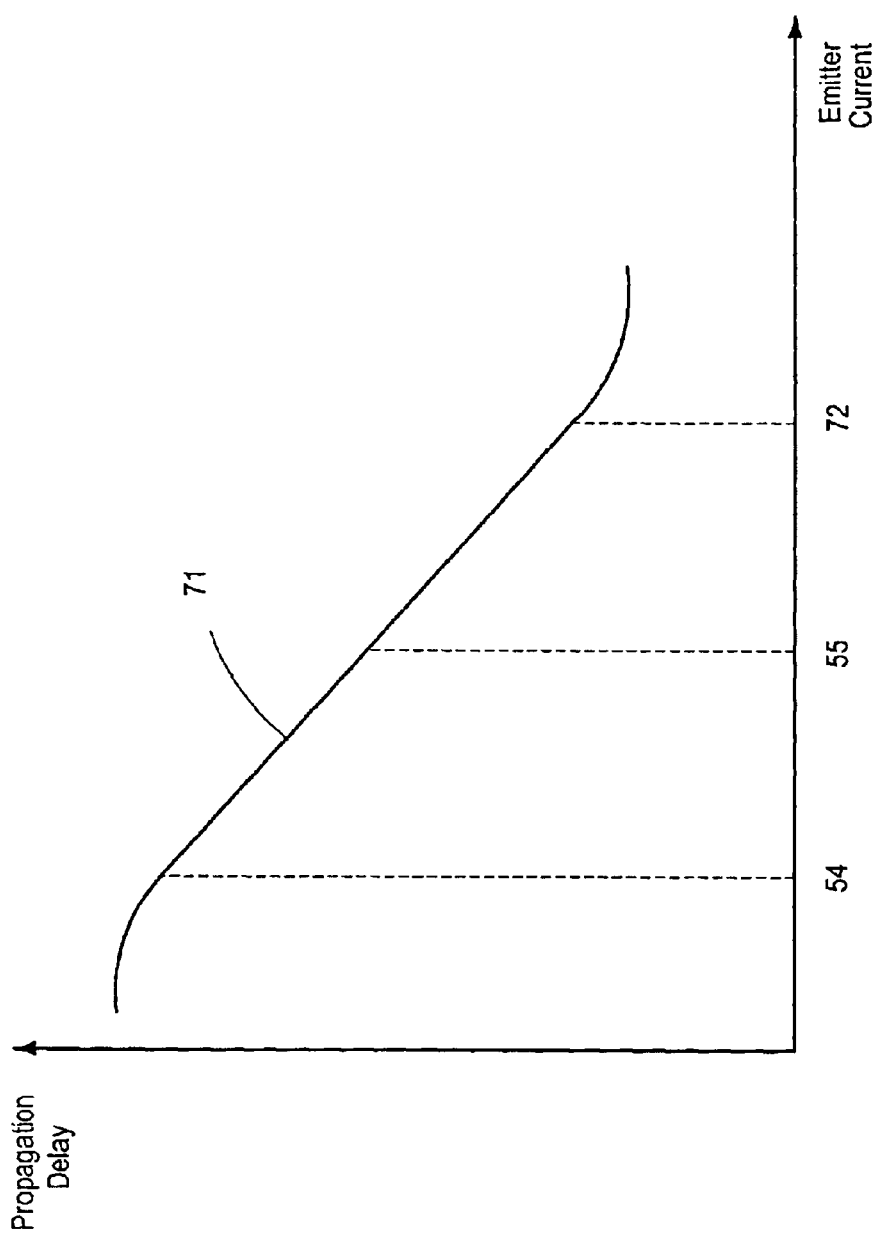
FIG. 5 is a graph illustrating some characteristics of the differential amplifier of FIG. 4 in accordance with the present invention.

FIG. 5 is a graph having a plot 71 illustrating the typical propagation delay verses emitter current characteristic of a transistor such as transistors 11 and 13 as explained in the description of FIG. 2 and FIG. 4. Referring to both FIG. 4 and FIG. 5, sources 15, 16, and 64 typically are formed so that the values of currents 46, 47, and 68 operate transistors 11 and 13 in the linear region of the propagation characteristics. For the characteristics illustrated in plot 71 currents 46, 47, and 68 are selected to bias transistors 11 and 13 to operate over a first range of bias current values between a first set of operating points, including first operating point 54 and second operating point 55, and to operate over a second range of bias current values between a second set of operating points including second operating point 55 and a third operating point 72. The first set of operating points form a first propagation delay range and the second set of operating points form a second propagation delay range.

Source 16 is formed so that the value of current 46 biases transistors 11 and 13 to operate at first point 54 when transistors 21 and 61 are disabled. The value of current 47 is formed so that currents 46 and 47 add to form the second bias current and bias transistors 11 and 13 to operate at second point 55 when transistor 21 is fully enabled and transistor 61 is disabled. The value of current 68 is formed so that currents 46 and 68 add together to form a third bias current that bias transistors 11 and 13 to operate at second point 55 when transistor 21 is disabled and transistor 61 is enabled. The value of currents 46, 47, and 68 add to form a fourth bias current to operate transistors 11 and 13 at point 72 when transistors 61 and 21 are both fully enabled. Thus, when transistor 61 is disabled, transistors 21 and 22 provide the variable propagation delay between operating points 54 and 55 as explained in the description of FIGS. 1 and 2. When transistor 61 is enabled, transistor 62 is disabled and fixed bias current 46 adds with select bias current 68 so that transistors 21 and 22 bias transistors 11 and 13 to operate between points 55 and 72 responsively to the value of the delay control signal. Consequently, source 15 still provides a variable propagation delay as explained previously, however, the variable propagation delay is switched to operate in the first propagation delay range or the second propagation delay range responsively to the range select control signal. Thus, range select current source 64 increases the bias current flowing through transistors 11 and 13 and facilitates switching transistors 11 and 13 from operating at one propagation delay range, such as between points 54 and 55, to a second propagation delay range, for example between points 55 and 72. As indicated hereinbefore, transistors 11 and 13 have a large linear operating range. Using two different propagation delay ranges allows more control of the gain of source 15 and of the value of resistor 26 thereby reducing the susceptibility to noise when a large gain is desired, and reducing jitter in the output signal.

In order to facilitate this operation, transistor 61 has a base connected to input 67, collector connected to node 19, and an emitter connected to a first terminal of source 63 which has a second terminal connected to return 32. Transistor 62 has a base connected to input 66, a collector connected to node 20, and an emitter connected to the emitter of transistor 61.

It should be noted that the first and second propagation delay ranges can be separated from each other. For example the second propagation delay range does not have to start at point 55 but could be displaced to the right closer to point 72. Also, the second propagation delay range could overlap the first propagation delay range and could begin to the left of point 55. Furthermore, amplifier 60 could have a plurality of propagation delay ranges and a corresponding plurality of range select current sources 64, as illustrated in phantom by a dashed box 75 in FIG. 4, that respond to a plurality of range select control signals.

FIG. 6 schematically illustrates a plan view of a semiconductor device 80 that is formed on a semiconductor die 81. Differential amplifier 60 may be formed on die 81 along with oscillator 70 that could be formed as a portion of a phase locked loop 82. Die 81 typically includes other functional elements that are not shown in FIG. 6 for clarity of the illustration.

In view of all of the above, it is evident that a novel device and method is disclosed. Included, among other features, is changing the propagation delay of a differential amplifier by changing the bias current of a differential transistor pair of the differential amplifier. Changing the bias current to change the propagation delay keeps the output voltage swing constant and prevents saturation of successive stage, improves the linearity of the propagation delay, and reduces cycle-to-cycle jitter. Using a plurality of range select current sources facilitates operating the differential amplifier with a plurality of propagation delay ranges thereby further minimizing jitter in the output signal.

While the invention is described with specific preferred embodiments and some alternatives, it is evident that many other alternatives and variations will be apparent to those skilled in the semiconductor arts. More specifically the invention has been described for a particular NPN transistor structure, although the method is directly applicable to other bipolar transistors, as well as to MOS, BiCMOS, metal semiconductor FETs (MESFETs), HFETs, and other transistor structures.

What is claimed is:

1. A method of forming a differential amplifier with a variable propagation delay comprising:
   forming the differential amplifier to have an output voltage having a voltage swing; and
   coupling a differential input transistor pair of the differential amplifier to receive a first bias current that generates a first propagation delay through the differential pair and to receive a second bias current that generates a second propagation delay through the differential pair including forming the differential amplifier to maintain the voltage swing constant for receiving the first bias current and receiving the second bias current.

2. The method of claim 1 wherein coupling the differential input transistor pair to receive the first bias current that generates the first propagation delay through the differential pair and to receive the second bias current that generates the second propagation delay includes forming the differential amplifier to generate a portion of the second bias current as a variable current that varies the second propagation delay over a first propagation delay range.

3. The method of claim 2 wherein forming the differential amplifier to generate the portion of the second bias current as the variable current includes forming the differential amplifier to generate a value of the variable current responsively to a delay control signal.

4. The method of claim 2 further including forming the amplifier to couple the differential input transistor pair responsively to a range select control signal to receive a third bias current that generates a third propagation delay and to receive a fourth bias current that generates a fourth propagation delay wherein a portion of the fourth bias current is formed as the variable current and varies the fourth propagation delay over a second propagation delay range.

5. The method of claim 1 wherein coupling the differential input transistor pair to receive the first bias current that generates the first propagation delay through the differential pair and to receive the second bias current that generates the second propagation delay includes coupling the differential input transistor pair to receive the first bias current from a first current source and to receive at least a portion of the second bias current from a second current source.

6. The method of claim 5 wherein coupling the differential input transistor pair of the differential amplifier to receive the first bias current from the first current source and to receive the at least the portion of the second bias current from the second current source includes forming the second current source to supply the at least the portion of the second bias current as a variable bias current responsively to a delay control signal.

7. The method of claim 1 wherein forming the differential amplifier to have the output voltage having the voltage swing includes coupling a load resistor to receive a load current wherein the load current is greater than the first bias current and no less than the second bias current.

8. A method of forming a differential amplifier with a variable propagation delay comprising:
   forming the differential amplifier to have an output voltage having a voltage swing; and
   coupling a differential input transistor pair of the differential amplifier to receive a first bias current that generates a first propagation delay and to receive a second bias current that generates a second propagation delay including forming the differential amplifier to maintain the voltage swing constant for receiving the first bias current and receiving the second bias current
   coupling a load resistor to receive a load current wherein the load current is greater than the first bias current and no less than the second bias current; and
   forming a steering transistor pair coupled to receive an excess current that is a difference between the load current and the second bias current.

9. The method of claim 8 further including forming a delay control transistor coupled to receive a delay control signal and responsively couple the excess current to a second current source and to a third current source.

10. A method of forming a differential amplifier with a variable propagation delay comprising:
    forming the differential amplifier to have an output voltage having a voltage swing;
    coupling a differential input transistor pair of the differential amplifier to receive a first bias current that generates a first propagation delay and to receive a second bias current that generates a second propagation delay including forming the differential amplifier to maintain the voltage swing constant for receiving the first bias current and receiving the second bias current and
    coupling a load resistor to receive a load current wherein the load current is greater than the first bias current and no less than the second bias current including coupling the load resistor to receive the second bias current as a portion of the load current responsively to a delay control signal.

11. The method of claim 1 wherein coupling the differential input transistor pair to receive the first bias current that generates the first propagation delay through the differential pair and to receive the second bias current that generates the second propagation delay includes coupling the differential input transistor pair to receive tho second bias current responsively to a delay control signal.

12. The method of claim 1 further including switching the differential input transistor pair responsively to a range select control signal to receive a third bias current that generates a third propagation delay and to receive a fourth bias current that generates a fourth propagation delay wherein the third bias current arid the fourth bias current are formed responsively to a control signal input.

13. A method of forming a variable propagation delay for a differential amplifier comprising:
providing a differential amplifier having a differential input pair; and
varying a value of a bias current through the differential input pair over a first range of bias current values responsively to a delay control signal while maintaining a load current of the differential amplifier constant.

14. A method of forming a variable propagation delay for a differential amplifier comprising:
providing a differential amplifier having a differential input pair; and
varying a value of a bias current through the differential input pair over a first range of bias current values responsively to a delay control signal while maintaining a load current of the differential amplifier constant including establishing a first bias current from a first current source through the differential input pair and varying a Second bias current from a second current source through the differential input pair responsively to the delay control signal.

15. The method of claim 13 further including switching the value of the bias current responsively to a range select control signal to vary over a second range of bias current values and varying the value of the bias current over the second range of bias current values responsively to the delay control signal.

16. The method of claim 13 wherein maintaining the load current of the differential amplifier constant includes conducting a first portion of the load current through the differential input pair, and responsively to the delay control signal steering a second portion of the load current through a current source and not through the differential input pair.

17. The method of claim 16 wherein steering the second portion of the load current through the current source and not through the differential input pair includes steering the second portion of the load current from a load resistor and through a steering transistor to the current source.

18. A variable propagation delay differential amplifier comprising:
a first transistor of a differential pair having a control electrode coupled to a first data input, a first current carrying electrode coupled to a first output of the variable propagation delay differential amplifier, and a second current carrying electrode;
a first load resistor having a first terminal coupled to the first current carrying electrode of the first transistor, and a second terminal coupled to a power input;
a second load resistor having a first terminal coupled to the power input, and a second terminal coupled to a second output of the variable propagation delay differential amplifier;
a second transistor of the differential pair having a first current carrying electrode coupled to the second output of the variable propagation delay differential amplifier, a control electrode coupled to a second to data input, and a second current carrying electrode coupled to the second current carrying electrode of the first transistor;

a first current source having a first terminal coupled to the second current carrying electrode of the first transistor, and a second terminal coupled to a power return; and
a variable current source operably coupled to form a current wherein at least a portion of the current flows through one of the first load resistor and the second load resistor but not through either of the first transistor or the second transistor, the variable, current source having a first terminal coupled to the second current carrying electrode of the second transistor, and a second terminal coupled to the power return.

19. The variable propagation delay differential amplifier of claim 18 wherein the variable current source includes a third transistor having a control electrode coupled to a first control input, a first current carrying electrode coupled to the second current carrying electrode of the second transistor, and a second current carrying electrode coupled to a first terminal of a gain resistor;
a fourth transistor having a control electrode coupled to a second control input, a first current carrying electrode coupled to a second terminal of the gain resistor, and a second current carrying electrode;
a second current source having a first terminal coupled to the first terminal of the gain resistor and a second terminal coupled to the power return;
a third current source having a first terminal coupled to the second terminal of the gain resistor and a second terminal coupled to the power return;
a fifth transistor having a control electrode coupled to the second output of the variable propagation delay differential amplifier, a first current carrying electrode coupled to the first output of the variable propagation delay differential amplifier, and a second current carrying electrode coupled to the second current carrying electrode of the fourth transistor; and
a sixth transistor having a control electrode coupled to the first output of the variable propagation delay differential amplifier, a first current carrying electrode coupled to the second output of the variable propagation delay differential amplifier, and a second current carrying electrode coupled to the second current carrying electrode of the fifth transistor.

20. The variable propagation delay differential amplifier of claim 19 further including a seventh transistor having a control electrode coupled to a first range select control input, a first current carrying electrode coupled to the second current carrying electrode of the second transistor, and a second current carrying electrode;
an eighth transistor having a control electrode coupled to a second range select control input, a first current carrying electrode coupled to the second current carrying electrode of the fourth transistor, and a second current carrying electrode coupled to the second current carrying electrode of the seventh transistor; and
a fourth current source having a first terminal coupled to second current carrying electrode of the seventh transistor, and a second terminal coupled to the power return.

* * * * *